United States Patent [19]

Tada et al.

[11] Patent Number: 4,888,715
[45] Date of Patent: Dec. 19, 1989

[54] SEMICONDUCTOR TEST SYSTEM

[75] Inventors: Tetsuo Tada; Hideo Matsui, both of Itami, Japan

[73] Assignee: Mitsubishi Denki Kabushiki Kaisha, Tokyo, Japan

[21] Appl. No.: 799,726

[22] Filed: Nov. 19, 1985

[30] Foreign Application Priority Data

Dec. 3, 1984 [JP] Japan ................................. 59-255951

[51] Int. Cl.⁴ ............................................. G06F 11/00
[52] U.S. Cl. .................................... 364/550; 364/579; 364/580; 371/25.1; 371/27.1; 324/73 PC
[58] Field of Search ............ 324/158 R, 73 R, 73 AT, 324/73 PC, 158 F, 158 T; 371/25, 27, 16, 20, 15, 21, 29; 364/550, 579, 580

[56] References Cited

U.S. PATENT DOCUMENTS

| 4,503,536 | 3/1985 | Panzer | 371/25 |
| 4,523,312 | 6/1985 | Takguchi | 324/73 R |
| 4,631,724 | 12/1986 | Shimizo | 371/25 |
| 4,688,223 | 8/1987 | Motira et al. | 371/25 |
| 4,696,004 | 9/1987 | Nakajima et al. | 371/25 |
| 4,710,930 | 12/1987 | Hatayama et al. | 371/25 |
| 4,728,883 | 3/1988 | Green | 371/25 |

FOREIGN PATENT DOCUMENTS

0216069 12/1984 Japan ................................. 371/25

OTHER PUBLICATIONS

Nevitt et al., Diagnosing LSI Component Failures, IBM Technical Disclosure Bulletin, vol. 23, No. 4, p. 1514, 9/80.
Seth, Data Compression Techniques in Logic Testing, U.S.Q, pp. 99–114, 2/77.
GenRad Semiconductor Test Inc., Milpitas, CA: Model GR18 General Purpose Complex VLSI Test System Standard Product Description and Specifications, Sep. 1983.
Fairchild Camera and Instrument Corporation, "VLSI Component Test System Product Description", Pub. No. 57140001, ECO No. 13269, May 1984.

Primary Examiner—Parshotam S. Lall
Assistant Examiner—Ellis B. Ramirez
Attorney, Agent, or Firm—Lowe, Price, LeBlanc, Becker and Shur

[57] ABSTRACT

A semiconductor test system comprises an expected value storage area for storing expected values of output data supplied from a semiconductor device under test, a memory device for storing output data directly supplied from the semiconductor device under test in the form of the identical code with that of the expected value storage area, and a comparator for comparing output data from the memory device directly with expected values from the expected value storage area without any conversion.

9 Claims, 5 Drawing Sheets

FIG. 2

| DUT TERMINAL NO. → | 1 | | | | 11 | | | | 21 | | | | 31 | | | | 40 |
|---|---|---|---|---|---|---|---|---|---|---|---|---|---|---|---|---|---|

(a) INSTRUCTION          (b) TRUTH TABLE

FIG.4

| INSTRUCTION | MACHINE CODE (HEXADECIMAL) |
|---|---|
| NOP | 0  0 |
| LXI  B | 0  1 |
| ⟨B 2⟩ | ⟨B 2⟩ |
| ⟨B 3⟩ | ⟨B 3⟩ |
| LXI  H | 2  1 |
| ⟨B 2⟩ | ⟨B 2⟩ |
| ⟨B 3⟩ | ⟨B 3⟩ |

SEMICONDUCTOR TEST SYSTEM

BACKGROUND OF THE INVENTION

1. Field of the Invention

The present invention relates to a semiconductor test system for testing and evaluating functions of a semiconductor device at a high speed.

2. Description of the Prior Art

FIG. 1 is a schematic diagram showing a conventional semiconductor test system. The semiconductor test system as shown in FIG. 1 is formed by a magnetic disk unit 2 for storing a test program for performing a functional test to evaluate a semiconductor device to be tested (hereinafter referred to as "DUT") 1, a storage area 3 for storing data to be applied to respective terminals of an input terminal group 1a of the DUT 1 and expected values of outputs from an output terminal group 1b thereof in the form of truth tables respectively, a clock generator 4 for generating clock waveforms to be applied to the respective input terminals of the DUT 1 on the basis of the truth tables held in the storage area 3 and a comparator 5 for receiving output information from respective output terminals of the DUT 1 to distinguish the same by a predetermined threshold value and digitalize the same thereby to compare the digitalized output information with the expected output values included in the truth tables in the storage area 3. Symbol A depicts examples of input response series of clock waveforms supplied from the clock generator 4 to the DUT 1, and symbol B depicts examples of output waveforms from the DUT 1. The term "clock waveforms" herein used indicates those as shown by symbol A in FIG. 1, which are in binary voltage values and capable of freely setting binary changes in a certain period and applicable as a waveform group with each waveform varied in type in identical period.

Operation of the conventional semiconductor test system is now described. Information on input/output response series in/from the DUT 1, i.e., so-called test patterns, is generally retained in the magnetic disk unit 2 in the form of program files. The test patterns are stored in the storage area 3 (generally contained in the semiconductor test system) as input/output series corresponding in number to the terminals of the input and output terminal groups 1a and 1b of the DUT 1, to be easily applicable to the same. In other words, the test patterns are held in the storage area 3 in the form of a table of truth values (1, 0, X or H, L, Z etc.) which is expanded two-dimensionally with respect to the number of the terminals of the DUT 1 and time transition (depth) of test executing operation. The input series (test patterns) included in the truth tables in the storage area 3 is supplied to the respective terminals of the input terminal group 1a of the DUT 1 as a clock waveform group according to the truth table through the clock generator 4. The DUT 1 operates (making a functional operation) in response to the applied input series (clock waveforms) A, and then generates an output response series group B from its output terminal group 1b to supply the same to the comparator 5. The output response series group B is generally outputted in the form of the aforementioned clock waveforms.

The comparator 5 receives the output response series B to convert the same into truth values (1, 0, X or H, L, Z etc.) and compares the truth values with the expected output series included in the truth tables held in the storage area 3, thereby to generate a PASS signal when the output response series in the form of the truth values coincides with the expected output response series while generating a FAIL signal when the former does not coincide with the latter. Namely, the comparator 5 changes the output response series B received from the DUT 1 to truth values thereby to compare the same with the expected output response series held in the storage area 3 in real time.

In the aforementioned structure, however, the input and output response series held in the storage area 3 are two-dimensionally arrayed in the directions of the number of terminals and the time (depth), in order to be capable of changing them with respect to time for all of the input and output terminals of the DUT 1, and hence the truth tables are remarkably enlarged in scale with increase of the test patterns.

Also proposed in the art is a system which repeatedly rewrites truth tables in a storage area, whereas such system involves generation of dummy (waste) times associated with rewriting the test patterns and various restrictions for facilitating rewriting of the test patterns themselves.

A microcomputer or microprocessor which has a plurality of internal functions, unlike random logic circuits, operates in combination of the functions associated with each other to perform a given instructions. Therefore, when a semiconductor test system generates prescribed instructions to be executed on a microprocessor or microcomputer, one instruction to be executed may correspond to several operational cycles of the semiconductor test system, and the functional test cannot be performed at a high speed in practice. This will be described below with reference to FIG. 2.

Figure 2:
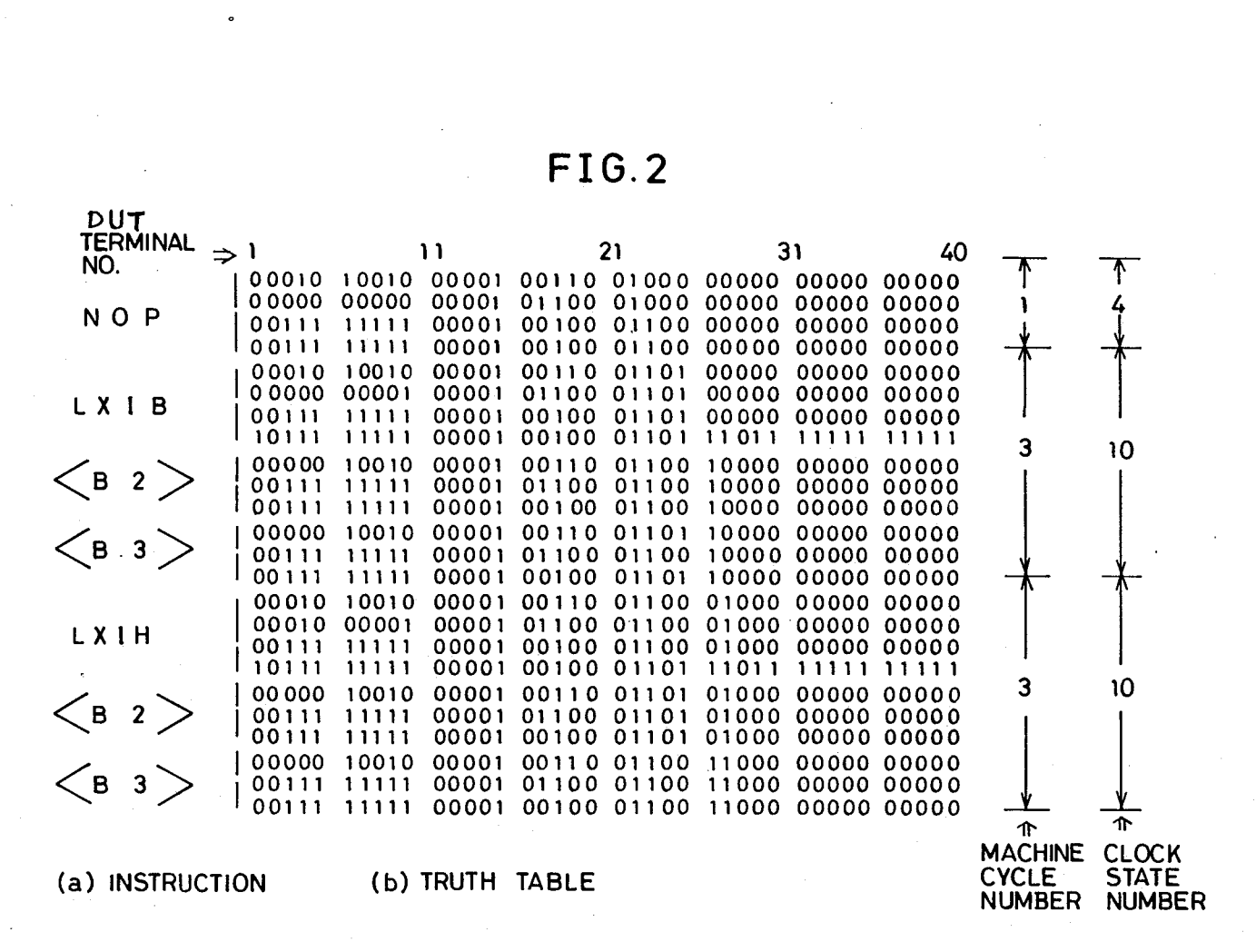

FIG. 2 illustrates given instructions to be executed and corresponding truth tables in a conventional truth table system.

Now considered are patterns of "1" and "0" (input and expected output series) which are required for instructions to be executed "NOP", "LXI B" and "LXI H" (FIG. 2(a)). As obvious from FIG. 2, an instruction "NOP" is of one machine cycle and requires four clock states. The instructions "LXI B" and "LXI H" are of three machine cycles, both requiring ten clock states. Therefore, 24 clock states (i.e., 4+10+10) are required for executing the instructions as shown in FIG. 2(a), leading to a large scale truth table as shown in FIG. 2(b).

Further, assigned to one clock state is one test period. Therefore, if the instructions as shown in FIG. 2(a) are executed by a semiconductor test system having a maximum operation cycle of 25 nsec. (40 MHz) for one test cycle, complete execution of the instructions requires 25×24=600 nsec., leading to increase in execution time.

With respect to correction of the truth tables, further enlargement in scale of the truth tables involves erroneous changes of the truth values "0" and "1" as well as increased time consumption for searching the positions for their values to be changed, leading to reduced efficiency.

Now considered is the time required for forming truth tables in a semiconductor test system. Information for the truth tables is generally stored in the magnetic disk unit 2 as shown in FIG. 1, and transferred (loaded) at need to the storage area 3 for holding the truth tables. Therefore, the transfer time would increase with increase in the amount of information (i.e., truth tables) to be transferred. Further, enlargement in integration scale of the DUT 1 is followed by increase in scale of the truth tables formed in correspondence thereto, and such large-scale truth tables cannot be stored within the capacity of storage areas available at present.

In the semiconductor test system which generates clock waveforms of input/output series to/from the DUT in accordance with large-scale truth tables so as to execute a functional test of DUT, further, highly sophisticated technique is required in structure, precision etc. to cope with fast operation, leading to increase in cost.

Examples of conventional semiconductor test system in the above structure are disclosed in "Model GR18 General Purpose Complex VLSI Test System Standard Product Description and Specifications", General Semiconductor Test Inc., P/N 24180373, Rev. E, Sept. 1983 and "Sentry 50 VLSI Component Test System Product Description", Fairchild Camera and Instrument Corporation, No. 5714001, April 1983.

SUMMARY OF THE INVENTION

Accordingly, an object of the present invention is to overcome the aforementioned disadvantages of the prior art and provide a semiconductor test system which reduces capacity of a storage area for holding large-scale truth tables and substantially removes dummy times in execution of instructions, while extremely simplifying the manner of altering input/output series.

The semiconductor test system according to the present invention is provided with a dedicated external storage area formed by, for example., an RAM (random access memory) or ROM (read only memory) to store instructions to be executed and results of instruction-executing operation from a semiconductor device to be tested (DUT) in the form of internal (machine) codes specific to the DUT, so as to perform direct input/output response between the dedicated storage area and the DUT. A test program supplied to the dedicated storage area is stored in a test program storage area in the form of a programming language, so that the instructions to be executed is written in the dedicated storage area along the test program from the test program storage area through a clock generator.

Further, the test program storage area stores expected values of results of instruction executing operation of the DUT in the form of machine codes.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 shows examples of a run command group and truth tables corresponding to the same;

FIG. 4 illustrates an example of a machine-coded run command group; and

DESCRIPTION OF THE PREFERRED EMBODIMENTS

Description is now made on preferred embodiments of the present invention with reference to the accompanying drawings.

Figure 1:
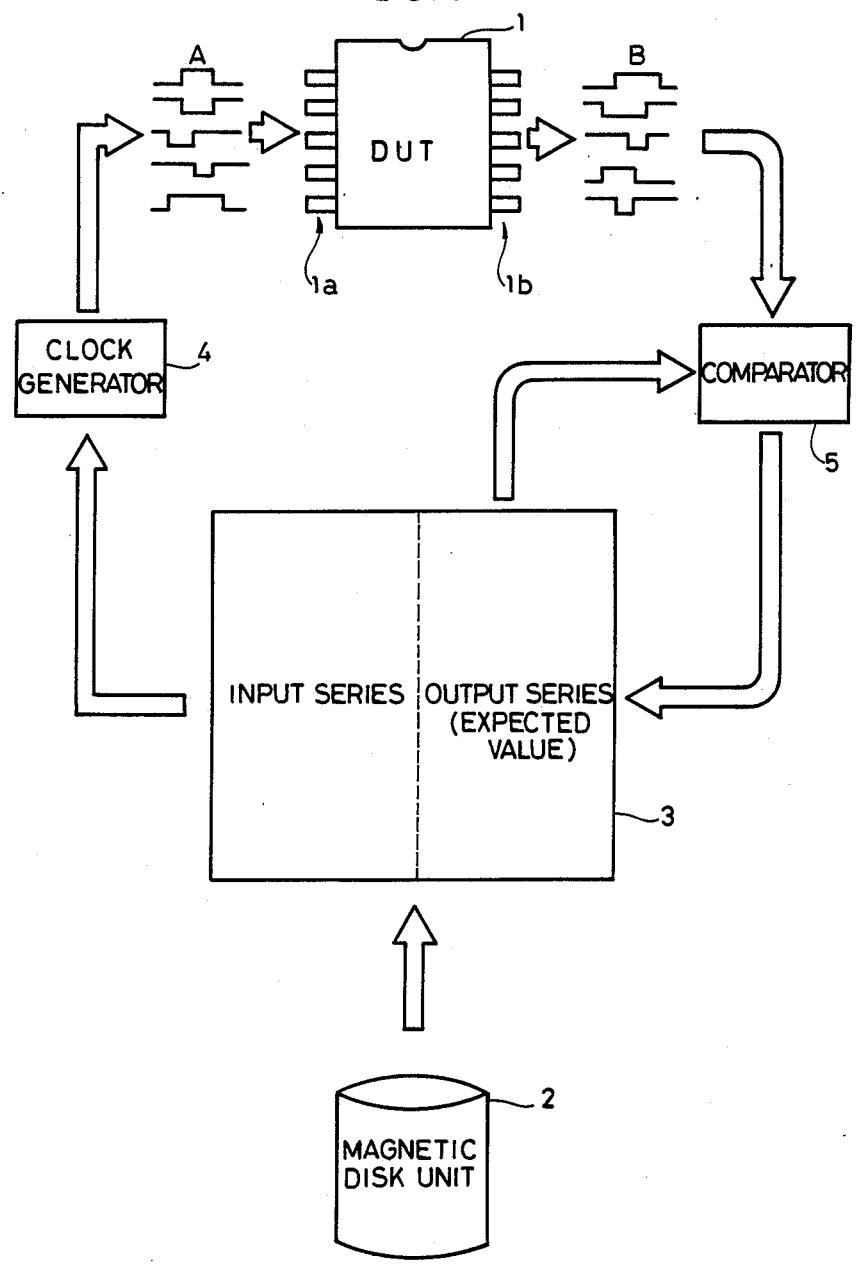
FIG. 1 is a schematic diagram showing a conventional semiconductor test system.
Figure 3:
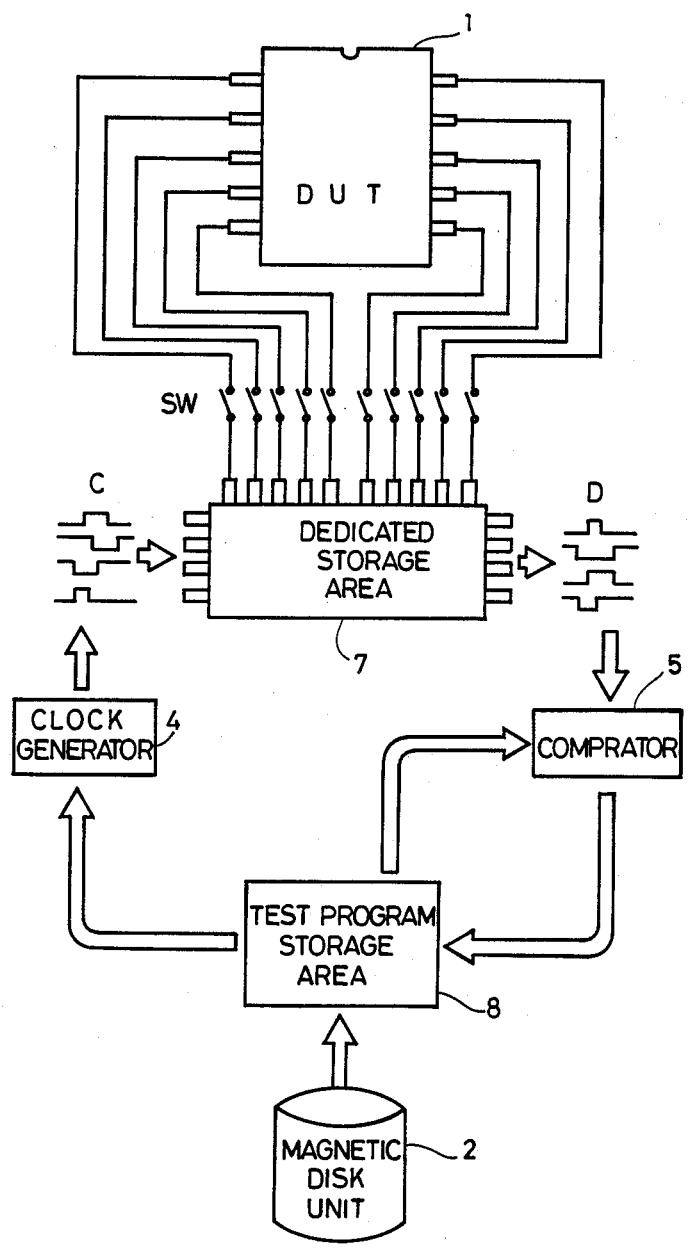
FIG. 3 is a schematic diagram showing a semiconductor test system according to an embodiment of the present invention.

FIG. 3 is a schematic diagram showing a semiconductor test system according to an embodiment of the present invention. In FIG. 3, components identical to those of the conventional semiconductor test system as shown in FIG. 1 are indicated by the same reference numerals. The present invention is characterized in that a dedicated storage area 7 is newly provided for storing a run command group which is machine-coded (internal-coded) in order to facilitate functional operation of a DUT 1 at a speed approximate to the actual operational time. The dedicated storage area 7 is provided with an internal instruction section (not shown) for executing instructions of the run command group and an internal data section (not shown) for storing results of the functional operation from the DUT 1.

Between the DUT 1 and the dedicated storage area 7, a switch group SW is provided for directly supplying information (machine codes of the run command group) stored in the internal instruction section of the dedicated storage area 7 in the form of internal (machine) codes while making the internal data section of the dedicated storage area 7 hold data resulting from the functional operation of the DUT 1 in the form of the internal (machine) codes.

Preferably a test program storage area 8 is formed by a counter type algorithmic generator so as to hold so-called test program for indicating functions to write/read the internal (machine) codes of the DUT 1 in/from the dedicated storage area 7 as the program for the semiconductor test system.

Symbol C depicts a clock waveform group formed in a clock generator 4 on the basis of information created in the storage area 8 to be supplied to the dedicated storage area 7. Symbol D depicts an output response group supplied from the dedicated storage area 7 to the comparator 5.

FIG. 4 illustrates an example of a machine-coded run command group stored in the dedicated storage area 7. Thus, the test program storage area 8 stores not truth tables but the test program in the form of codes for the semiconductor test system, thereby to extremely reduce capacity required for the same in comparison with the conventional system.

Description is now made on operation of the semiconductor test system according to the present invention.

In preparation for a functional operation test, the switch group SW is turned off to separate the DUT 1 from the dedicated storage area 7. The test program storage area 8 stores input information (run command group) and expected output information to be compared with the same in the form of codes for the semiconductor test system. According to the input information from the test program storage area 8, the clock generator 4 supplies the clock waveform group C to the input terminals of the dedicated storage area 7. The dedicated storage area 7 receives the clock waveform group C for machine-coding the run command group and stores the same in its internal instruction section. Then the switch group SW is turned on to connect the DUT 1 to the dedicated storage area 7. In response to the machine-coded command group written in the dedicated storage area 7, the DUT 1 performs functional operation in the real operational time, so that output signals from the DUT 1 showing the results of the functional operation are stored in the data section of the dedicated storage area 7 in a sequential or compressed manner through the switch group SW. Thereafter the information (output results of the DUT 1) stored in the data section of the dedicated storage area 7 is supplied to the comparator 5, which in turn compares the same with expected output values stored in the storage area 8 in the form corresponding to the machine codes thereby to make a decision on "Pass or Fail". At this time, the comparator 5 compares the output response group D from the dedicated storage area 7 directly with the expected output values from the test program storage area 8, without changing the same to truth values.

In general, a DUT such as a microprocessor or microcomputer operating in unit of a function can sequentially make the function change by itself to change data according to its own internal codes and to make internal instruction codes change on the basis of the changed data. Thus, when the internal instruction section of the dedicated storage area 7 has only test execution sequence stored, the DUT 1 can thereafter execute its functions in response to changes of the internal data in a self-control manner.

Although the aforementioned semiconductor test system according to the embodiment processes only one DUT, the present invention is applicable to a plurality of DUTs.

Figure 5:
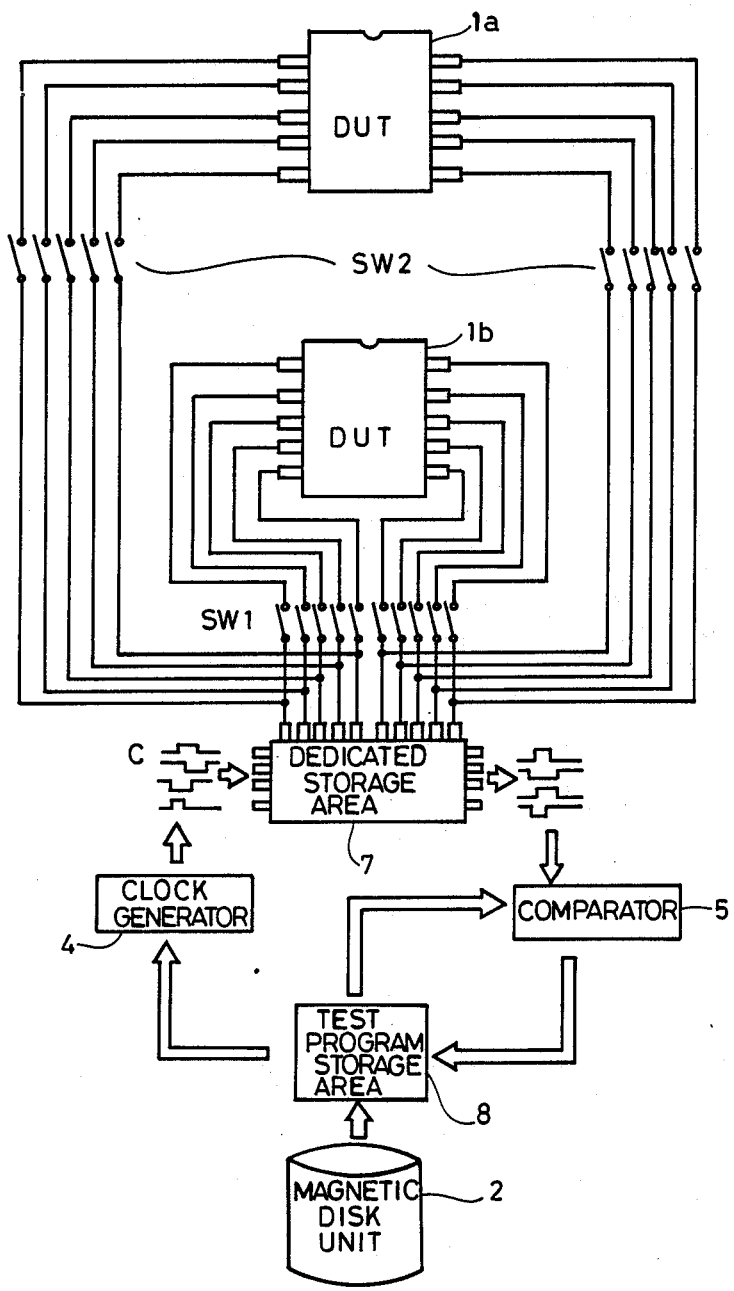
FIG. 5 is a schematic diagram showing a semiconductor test system according to another embodiment of the present invention.

FIG. 5 illustrates a semiconductor test system according to another embodiment of the present invention, which can perform functional tests on a plurality of DUTs. In FIG. 5, DUTs 1a and 1b are connected in parallel with a dedicated storage area 7 respectively through switch groups SW1 and SW2. In such structure, the DUT 1a can be tested by turning the switch group SW2 on and the switch group SW1 off, while the other DUT 1b can be tested by turning the switch group SW2 off and the switch group SW1 on. Needless to say, required in this case is that both of the DUTs 1a and 1b are provided with common internal codes to be subjected to identical functional tests.

In such structure, a plurality of DUTs of the same type can be tested with only one dedicated storage area, to facilitate test execution processing at a higher speed.

In the semiconductor test system according to the present invention, further, no direct input/output response is performed between truth tables and DUTs. Therefore, when the dedicated storage area is formed of a general RAM or ROM, a commercially available memory tester can be applied for testing, e.g., a microprocessor having a number of pins (terminals) and enormous test pattern length.

According to the present invention as hereinabove described, the test program (input information applied to the dedicated storage area and expected output value information) is converted into codes for the semiconductor test system to be stored in the test program storage area and the machine-coded run command group is stored in the external dedicated storage area so that input/output response is directly made between the dedicated storage area and the DUT and the outputs resulting from the DUT are directly stored in the external dedicated storage area.

Thus, as the test pattern length is extremely reduced in comparison with the truth table creation system, and there is substantially no dummy test executing time, it is possible to test the DUT at a speed approximate to its internal operation time in the semiconductor test system of the present invention.

Further, the semiconductor test system according to the present invention can be simply formed by providing only the external dedicated storage area, thereby to reduce cost therefor and improve productivity.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor test system for testing functions of a semiconductor device and evaluating the same, said semiconductor test system comprising:

first storage means for storing all the output data signals supplied from said semiconductor device to be tested, said semiconductor device operating along a predetermined procedure;

second storage means for storing said predetermined procedure in the form identical to internal machine code specific to said semiconductor device to be tested and for directly supplying said predetermined procedure to said semiconductor device to be tested;

expected value storage means for storing expected values of said all of the output data to be supplied from said semiconductor device to be tested in the form of codes identical to those stored in said first storage means; and comparator means for directly receiving all the output data signals from said first storage means and said expected value storage means to compare the same with each other to determine whether or not said device is faulty.

2. A semiconductor test system in accordance with claim 1, further including third storage means for storing a test program supplying said predetermined procedure in the form of a programming language and means for writing said predetermined procedure in said first storage means along a test program from said third storage means.

3. A semiconductor test system for testing functions of a microprocessor or microcomputer under test comprising:

first storage means for storing machine codes supplied from performance of said functions by said microprocessor or microcomputer under test, said microprocessor or microcomputer operating along a predetermined procedure;

expected machine code storage means for storing expected machine codes to be supplied from performance of said functions by said microprocessor or microcomputer under test; and comparison means for receiving machine codes from both said first storage means and said expected machine code storage means to compare said received machine codes and said expected machine code from said microprocessor or microcomputer under test, wherein said first storage means is operable for storing all the machine code provided from the microprocessor or microcomputer under test and said expected value storage means is operable for storing expected values of said all of the machine code to be provided from the microprocessor or microcomputer under test, whereby proper or faulty functioning of the microprocessor or microcomputer under test is determined.

4. A semiconductor test system as recited in claim 3, wherein said comparison means is operable for comparing said machine codes provided from the microprocessor or microcomputer under test and said expected machine code every test cycle on all of the machine code signals.

5. A semiconductor test system as recited in claim 3, further comprising second storage means for storing said predetermined procedure in a form identical to internal machine code specific to said microprocessor or microcomputer under test and for directly supplying said predetermined procedure to said microprocessor or microcomputer under test.

6. A semiconductor test system as recited in claim 5, wherein said comparison means is operable for comparing said machine codes provided from the microprocessor or microcomputer under test and said expected machine code every test cycle on all of the machine code signals.

7. A semiconductor testing method for testing functions of a microprocessor or microcomputer comprising the steps of:

storing machine codes supplied from performance of said functions by said microprocessor or microcomputer under test, said microprocessor or microcomputer operating along a predetermined procedure;

storing expected machine codes to be supplied from performance of said functions by said microprocessor or microcomputer under test;

comparing said machine codes supplied from performance of said functions by said microprocessor or microcomputer under test with said expected machine codes supplied from said microprocessor or microcomputer under test, and determining proper or faulty functioning of the microprocessor or microcomputer under test, wherein said comparing step is performed every test cycle on all of the machine code signals provided from the microprocessor or microcomputer under test.

8. A semiconductor testing method as recited in claim 7, wherein said first mentioned storing step comprises storing all machine codes supplied from performance of said functions by said microprocessor or microcomputer under test, and said second mentioned storing step comprises storing expected values for all machine codes to be supplied from performance of said functions by said microprocessor or microcomputer under test.

9. A semiconductor testing method as recited in claim 8, comprising the further steps of storing said predetermined procedure in a form identical to internal machine code specific to said microprocessor or microcomputer under test and directly supplying said predetermined procedure to said microprocessor or microcomputer under test.

* * * * *